United States Patent
Kang

(10) Patent No.: US 8,358,544 B2
(45) Date of Patent: Jan. 22, 2013

(54) FLASH MEMORY DEVICE HAVING DUMMY CELL

(75) Inventor: Sang-gu Kang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/406,837

(22) Filed: Feb. 28, 2012

(65) Prior Publication Data

US 2012/0155184 A1    Jun. 21, 2012

Related U.S. Application Data

(62) Division of application No. 12/395,730, filed on Mar. 2, 2009, now Pat. No. 8,149,620, which is a division of application No. 11/523,571, filed on Sep. 20, 2006, now Pat. No. 7,518,920.

(30) Foreign Application Priority Data

Jan. 9, 2006    (KR) .................. 10-2006-0002310

(51) Int. Cl.
*G11C 16/04* (2006.01)

(52) U.S. Cl. ................. 365/185.29; 365/185.2

(58) Field of Classification Search ............. 365/185.29, 365/185.2
See application file for complete search history.

(56) References Cited

U.S. PATENT DOCUMENTS

| | | | |
|---|---|---|---|
| 6,181,598 B1 | 1/2001 | Matsubara et al. | |
| 6,462,998 B1 | 10/2002 | Proebsting | |
| 6,850,439 B1 | 2/2005 | Tanaka | |
| 6,856,543 B2 | 2/2005 | Atsumi et al. | |
| 7,099,193 B2 | 8/2006 | Futatsuyama | |
| 7,239,556 B2 | 7/2007 | Abe et al. | |
| 7,272,049 B2 | 9/2007 | Kang et al. | |
| 7,630,261 B2 | 12/2009 | Abe et al. | |
| 8,228,738 B2 * | 7/2012 | Park et al. | 365/185.17 |
| 2004/0113199 A1 | 6/2004 | Hazama et al. | |
| 2005/0007822 A1 | 1/2005 | Lee et al. | |
| 2005/0105334 A1 | 5/2005 | Futatsuyama | |
| 2005/0180213 A1 | 8/2005 | Abe et al. | |
| 2006/0114729 A1 | 6/2006 | Tanaka et al. | |
| 2007/0279981 A1 | 12/2007 | Abe et al. | |
| 2008/0304326 A1 * | 12/2008 | Kim et al. | 365/185.22 |
| 2009/0097326 A1 * | 4/2009 | Park et al. | 365/185.22 |
| 2009/0244967 A1 * | 10/2009 | Kim et al. | 365/185.2 |
| 2009/0262576 A1 * | 10/2009 | Moon et al. | 365/185.2 |
| 2010/0008136 A1 * | 1/2010 | Seol et al. | 365/185.2 |
| 2010/0214850 A1 * | 8/2010 | Hosono | 365/185.22 |
| 2011/0063917 A1 * | 3/2011 | Shiino et al. | 365/185.17 |
| 2011/0090738 A1 * | 4/2011 | Park et al. | 365/185.17 |
| 2011/0222340 A1 * | 9/2011 | Lee et al. | 365/185.2 |
| 2011/0235432 A1 * | 9/2011 | Kim et al. | 365/185.22 |
| 2012/0044764 A1 * | 2/2012 | Nakai et al. | 365/185.11 |
| 2012/0206968 A1 * | 8/2012 | Shiino et al. | 365/185.17 |

FOREIGN PATENT DOCUMENTS

| | | |
|---|---|---|
| JP | 2001-006377 | 1/2001 |
| JP | 2001-028196 | 1/2001 |
| JP | 2001-143483 | 5/2001 |
| JP | 2004-127346 | 4/2004 |
| JP | 2005-032422 | 2/2005 |
| JP | 2005108404 | 4/2005 |
| JP | 2005116119 | 4/2005 |
| JP | 2005235260 | 9/2005 |

(Continued)

*Primary Examiner* — Tuan T. Nguyen
(74) *Attorney, Agent, or Firm* — Volentine & Whitt, PLLC

(57) ABSTRACT

A nonvolatile semiconductor memory device includes a string selection transistor coupled to a bit line. The device also includes a plurality of memory cells coupled in series to the string selection transistor, wherein at least one of the memory cells is configured to be in a programmed state during an erase procedure of the plurality of memory cells.

9 Claims, 7 Drawing Sheets

FOREIGN PATENT DOCUMENTS

| | | |
|---|---|---|
| JP | 2005-339231 | 12/2005 |
| KR | 1993-0009064 | 5/1993 |
| KR | 1019940006684 B1 | 7/1994 |
| KR | 1997-0003255 | 1/1997 |
| KR | 100161413 B1 | 8/1998 |
| KR | 1020040070484 A | 8/2004 |
| KR | 1020050007817 A | 1/2005 |

* cited by examiner

|  | Program | Read | Erase | Dummy Cell Program |
|---|---|---|---|---|
| WL(Select) | Vpgm | Vrd | 0 | Vpass |
| WL(Unselect) | Vpass | Vread | 0 | Vpass |
| DWL | Vpass | Vread | 0 | Vpgm |
| SSL | Vcc | Vcc | Floating | Vcc |
| GSL | 0 | Vcc | Floating | 0 |
| CSL | 0 | 0 | Floating | 0 |
| BL | BL(Sel)=0V BL(Unsel)=Vcc | 0.5V | Floating | 0V |

US 8,358,544 B2

FLASH MEMORY DEVICE HAVING DUMMY CELL

CROSS-REFERENCE TO RELATED APPLICATIONS

This is a divisional of application Ser. No. 12/395,730, filed Mar. 2, 2009, which is a divisional of application Ser. No. 11/523,571, filed Sep. 20, 2006, now U.S. Pat. No. 7,518,920, issued Apr. 14, 2009, which is incorporated herein by reference in its entirety.

BACKGROUND OF THE INVENTION

1. Field of the Invention

The present invention relates to a semiconductor memory device and, in particular, to a NAND flash memory device that includes a dummy cell.

This U.S. non-provisional patent application claims priority under 35 U.S.C §119 to Korean Patent Application 2006-0023 10 filed on Jan. 9, 2006, the disclosure of which is hereby incorporated by reference in its entirety.

2. Description of the Related Art

Generally, NAND flash memory devices are programmed and erased using Fowler-Nordheim (F-N) tunneling. In F-N tunneling, electrons are injected/discharged from/to a channel region into/from a floating gate due to a large voltage difference between the channel region and a control gate of a cell transistor. Because of the relative ease in programming and erasing NAND flash memory devices, NAND flash memory devices are known to have good data storage characteristics as compared to other non-volatile memory devices. Moreover, NAND flash memory devices are also capable of high density integration, low power dissipation, and durability of percussion. These and other such features have helped increase the usage of NAND flash memory devices in recent years.

For example, the NAND flash memory is increasingly considered as a substitute for hard disk driver (HDD) as an auxiliary memory unit that is known as a solid state disk (SSD). While a SSD is considered to be inferior in capacity and cost to the HDD, the SSD is considered to be superior in access speed, miniaturization, and durability of percussion to the HDD. Moreover, it is expected that the progress of design and process technologies may increase the capacity and decrease the cost of the SSD. For these reasons, the SDD may be increasingly used as an auxiliary memory unit instead of the HDD.

While an increase in the integration density of memory cells in a semiconductor device may help reduce the size of the device, an increase in integration density may also cause problems. For example, the more highly integrated the memory device is, the more closely the memory cells are formed. This reduction in space between the memory cells may lead to an increase in coupling between memory cells. Furthermore, as the integration degree of the flash memory device is increased, a string may include more memory cells. This increase in memory cells with less space between them may cause a charge sharing phenomenon that may reduce a boosted channel voltage (e.g., about 9V) to a lower channel voltage (e.g., about 6V). The lowering of the channel voltage may make program-inhibit cells programmed. This programming of program-inhibit cells is generally undesirable.

FIG. 1 shows a schematic circuit diagram of a string structure of a conventional flash memory device. Referring to FIG. 1, a string comprises a string selection transistor SST, a ground selection transistor GST, and 32 memory cells MC<0> through MC<31> connected in series between the string selection transistor SST and the ground selection transistor GST. A drain of the string selection transistor SST is connected to a bit line and a source of the ground selection transistor GST is connected to a common source line CSL. A control gate of the string selection transistor SST is connected to a string selection line SSL and a control gate of the ground selection transistor GST is connected to a ground selection line GSL.

For exemplary purposes, it is assumed that a memory cell 10 is to be programmed and an adjacent memory cell MC<30> to the memory cell 10 is to be program-inhibited. Furthermore, a self-boosting scheme is used to program-inhibit the adjacent memory cell MC<30>. According to the program-inhibit method using the self-boosting scheme, a ground voltage (e.g., 0V) is applied to the control gate of the ground selection transistor GST so as to block a ground path of a string. The ground voltage is also applied to a selected bit line BL<m> connected to a string that comprises the memory cell 10 to be programmed. In addition, a source voltage (e.g., Vcc) is applied to an unselected bit line BL<m+1> connected to a string that comprises the memory cell MC<30> to be program-inhibited. Simultaneously, the source voltage (Vcc) is applied to the string selection line SSL. According to this bias condition, a source of the string selection transistor SST that is connected to the unselected bit line BL<m+1> is charged up to a voltage of (Vcc-Vth) (Vth is a threshold voltage of the SST). At this time, the SST is shut off so that the string with the memory cell to be program-inhibited is electrically isolated from the unselected bit line BL<m+1>. That is, the channel with the memory cell to be program-inhibited is floated.

Under this condition, a program voltage Vpgm is applied to a selected word line WL<30> and a pass voltage Vpass is applied to each of unselected word lines WL<0> through WL<29> and WL<31>. As a result, the channel of the program-inhibit memory cell (MC<30>) is self-boosted due to the capacitive coupling between its gate and channel, with the channel being floated. Furthermore, the voltage difference between the gate and the channel is so small that the electrons do not tunnel to the floating gate, thereby preventing the program-inhibit memory cell (MC<30>) from being programmed.

While the above-mentioned self-boosting scheme may be used to program-inhibit a memory cell, this scheme may not work as well in a high integration density memory device. For example, as the number of memory cells in a string increases, the charge-sharing of the self-boosted channel of the program-inhibited memory cell MC<30> increases. This reduces the channel voltage in the program-inhibited memory cell MC<30>. The resulting channel voltage decrease increases the voltage difference between the gate and the channel. This increase in the potential difference between the gate and channel may lead to an undesirable programming operation.

A local self-boosting scheme may be used to solve the above-mentioned problem. As depicted in FIG. 1, arrows indicate a charge-sharing direction and a programming direction. According to the local self-boosting scheme, a ground voltage of 0V is applied to two unselected word lines disposed at both sides of a selected word line. Furthermore, a program voltage Vpgm is applied to the selected word line after the pass voltage Vpass (e.g., about 10V) is applied to the remaining unselected word lines. Under the bias condition, the channel of a program-inhibited memory cell is locally boosted and the inactivated channels of two memory cells adjacent to the program-inhibited memory cell enables charges in the locally boosted channel to be blocked. As a result, the channel voltage of the program-inhibited memory cell is preserved so that the F-N tunneling in the program-inhibited memory cell is prevented.

While the local self boosting scheme may be used to prevent F-N tunneling in the program-prohibited memory cell, the scheme has several drawbacks. For example, the higher integration of the flash memory may narrow the interval between word lines. The narrow interval between word lines may result in a large coupling ratio between a selected word line (being applied with Vpgm) and unselected word lines (being applied with 0V). In other words, the voltage of unselected word lines may increase because of the coupling with the selected word line. This means that the unselected memory cells supplied with 0V are turned on because of charge sharing. Thus, because of the relatively large coupling ratio between unselected world lines and a selected word line, it may be undesirable to apply the local self boosting scheme to a highly integrated flash memory.

FIG. 2 shows a cross-sectional view of a string in FIG. 1. Referring to FIG. 2, a source voltage Vcc is applied to a gate of a string selection transistor SST and a bit line BL<m+1>. In addition, a ground voltage of 0V is applied to a ground selection transistor GST. Furthermore, a program voltage Vpgm is applied to a gate of a cell transistor MC<30> which is a program-inhibited memory cell. A pass voltage Vpass is applied to the remaining unselected word lines, respectively. Under this bias condition, a channel voltage of the cell transistor MC<30> is self-boosted such that the channel charge density of the cell transistor MC<30> is much higher than that of respective unselected cell transistors. However, cell transistors MC<0>~MC<29> are turned on because they are supplied with the pass voltage Vpass which is much higher than a threshold voltage. For this reason, the channels of the unselected cell transistors MC<0>~MC<29> are formed. Especially, in a case where a cell transistor has a low threshold voltage (or an erased state), the size of the channel formed may be enlarged because of the pass voltage Vpass applied to the cell transistor. The capacitance formed by channels of the unselected cell transistors MC<0>~MC<29> may share the boosted channel charge of the cell transistor MC<30>. This charge sharing causes a drop in the channel voltage of the cell transistor MC<30>. This drop in the channel voltage of the cell transistor MC<30> may lead to an undesirable programming operation due to increase in a voltage difference between the gate and the channel.

The above-mentioned drawback may become an important issue in a NAND flash memory device which starts a programming operation from a word line WL<0> in an ascending order. In other words, in a case where a selected word line is closer to the string selection transistor SST, the number of cell transistors which cause the charge sharing increase. This means that the total capacitance of channels increases as a selected word line becomes closer to the string selection transistor SST. Accordingly, as the channel capacitance of the unselected cell transistors increases, the charge shared amongst the cell transistor MC<30> and the unselected cell transistors increases, thus increasing the likelihood that the cell transistor MC<30> is programmed.

FIG. 3 shows a channel voltage drop caused by the charge sharing at a program-inhibited cell transistor. Referring to FIG. 3, the channel voltage of a memory cell MC<30> is set up to a voltage of Vcc-Vth when string and ground selection transistors SST and GST are biased to boost its channel. Furthermore, when the program voltage (Vpgm) is applied to the gate of the memory cell MC<30> at time t1, the channel of the program-inhibited memory cell MC<30> should be boosted up to Vch1 to inhibit F-N tunneling. However, the charge sharing causes the boosted channel voltage Vch1 (about 9V) to fall down to Vch2 (about 6V). This reduction in the voltage level of the channel in, the program-inhibited memory cell MC<30> due to charge sharing may cause the memory cell MC<30> to be programmed.

The present disclosure is directed towards overcoming one or more of the problems associates with conventional flash memory devices.

SUMMARY OF THE INVENTION

One aspect of the present invention includes a nonvolatile semiconductor memory device. The device includes a string selection transistor coupled to a bit line. The device also includes a plurality of memory cells coupled in series to the string selection transistor, wherein at least one of the memory cells is configured to be in a programmed state during an erase procedure of the plurality of memory cells.

Yet another aspect of the present invention includes a nonvolatile semiconductor memory device. The device includes a cell array including a plurality of blocks each of which is formed of a plurality of strings, each string including a plurality of memory cells assigned by an external address and connected to corresponding word lines and at least one memory cell not assigned by the external address and connected to a dummy word line. The device also includes a storage device configured to store position data that selects the at least one memory cell. The device also includes a pre-decoder configured to translate the external address to an internal address in response to the position data. The device also includes a decoder configured to supply word line voltages to the word lines in response to the internal address and a control signal. The device also includes a control unit configured to generate the control signal in response to the position data, wherein the control unit controls a driver so that the at least one memory cell connected to the dummy word line is programmed to a predetermined state after an erase operation.

Yet another aspect of the present disclosure includes a method for erasing a flash memory device. The method comprises of erasing memory cells connected to a plurality of word lines. The method also comprises of programming a memory cell connected to one of the plurality of word lines to a predetermined state.

BRIEF DESCRIPTION OF THE DRAWINGS

The teaching of the present invention can be readily understood by considering the following detailed description in conjunction with the accompanying drawings, in which.

DETAILED DESCRIPTION OF EXEMPLARY EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

Figure 1:
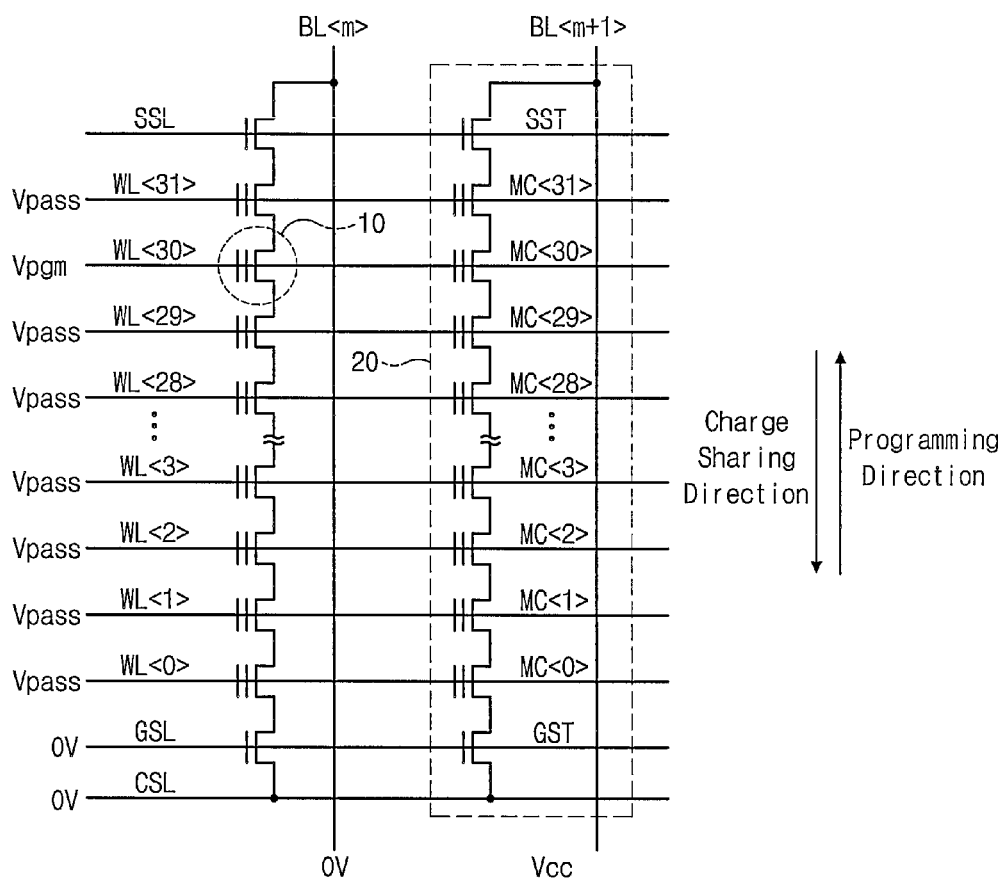
FIG. 1 is a schematic circuit diagram showing an array structure of a conventional NAND flash memory device.
Figure 2:
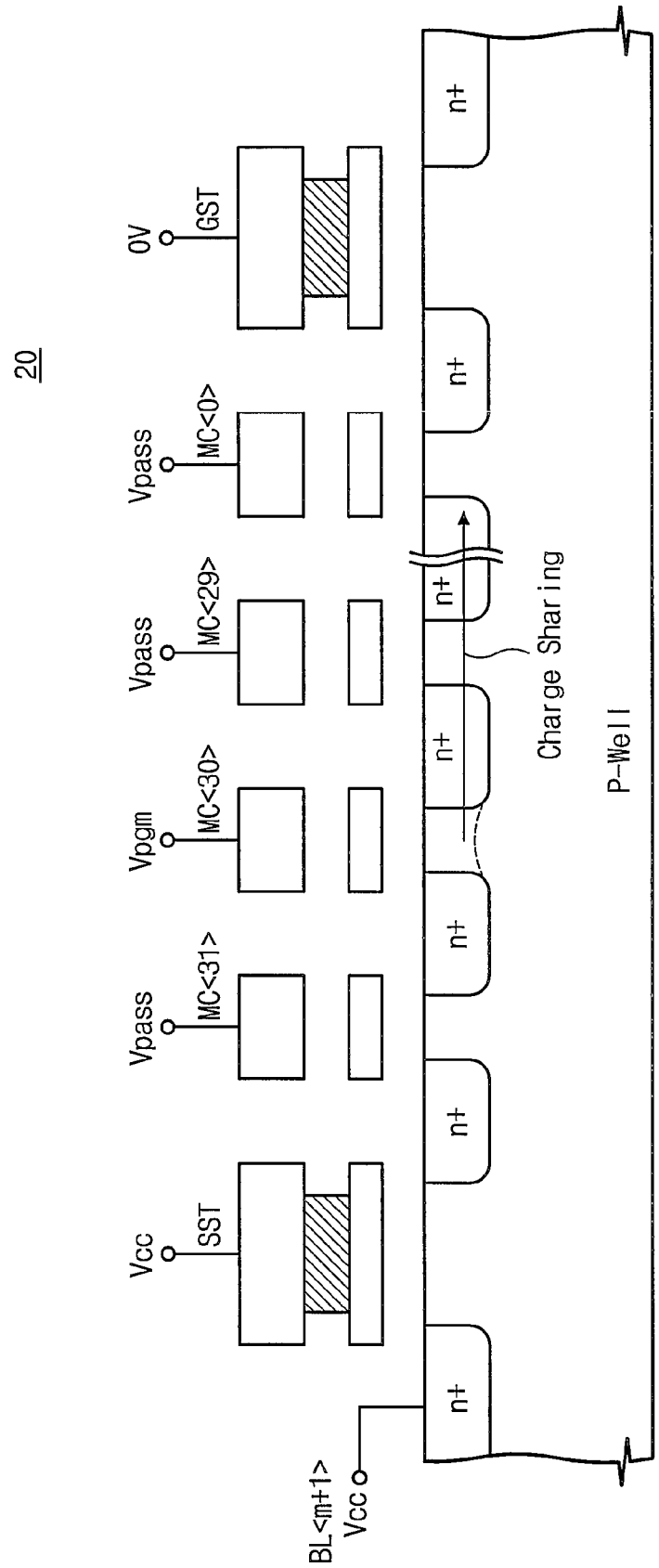
FIG. 2 shows a cross-sectional view of an unselected string in FIG. 1.
Figure 3:
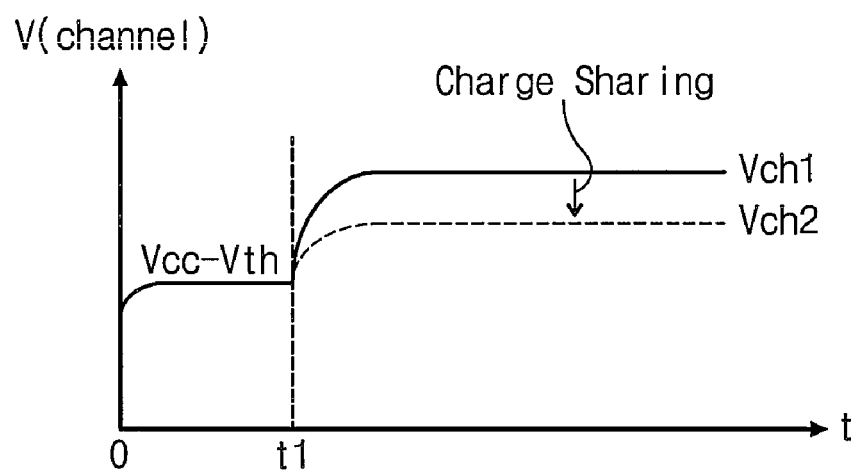
FIG. 3 shows channel voltage variations in the conventional NAND flash memory device of FIG. 1 caused by charge sharing.
Figure 4:
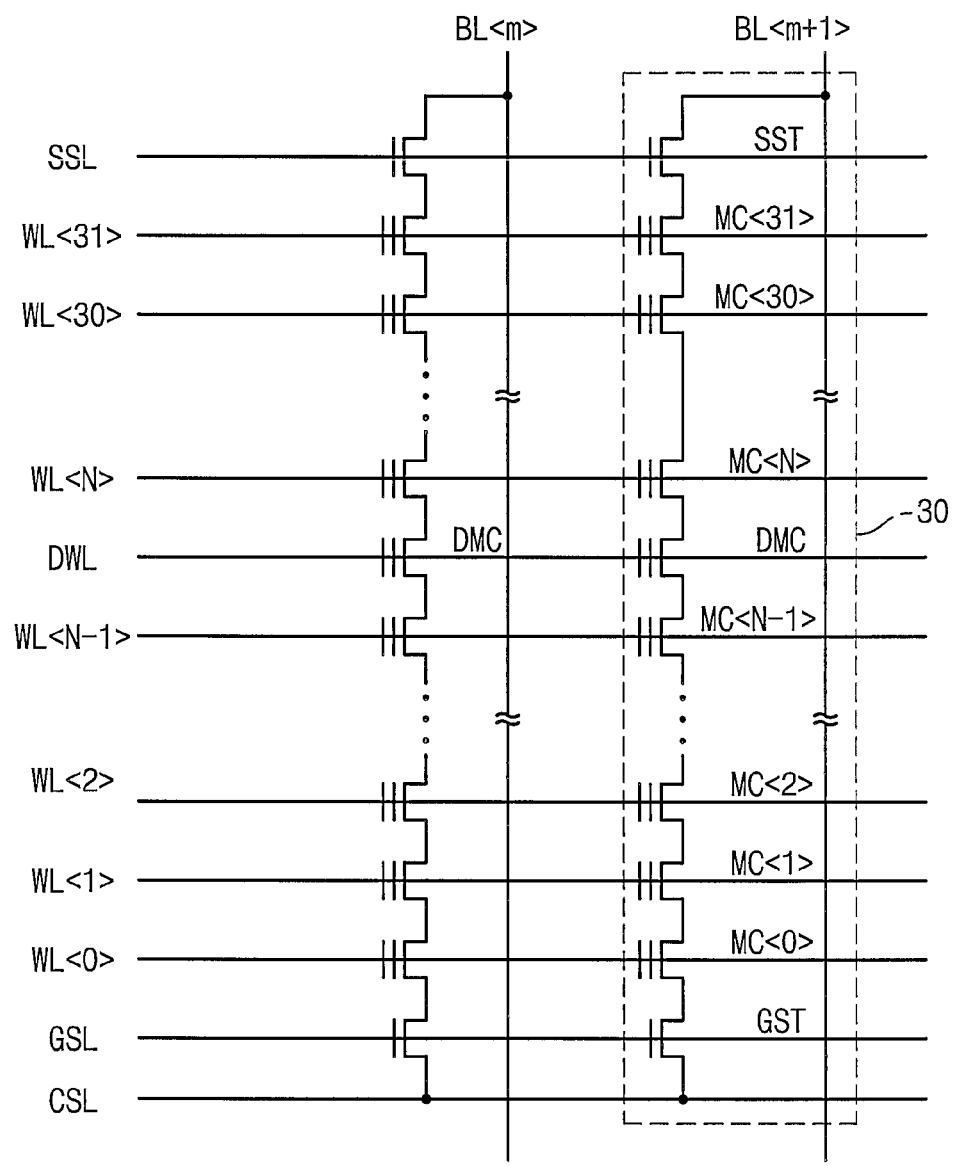
FIG. 4 is a schematic circuit diagram showing an array structure according to an exemplary disclosed embodiment of the present invention.

FIG. 4 shows a schematic circuit diagram of an array structure according to an exemplary disclosed embodiment. Referring to FIG. 4, a dummy cell DMC is placed in each of strings 30. In each string 30, the dummy cell DMC blocks the sharing of charges being boosted in a channel of a program-inhibited cell. Furthermore, in each of the strings 30, the dummy cell DMC has the same characteristics and performance as other memory cells in a corresponding sting. Generally, each of the strings includes 32 memory cells (hereinafter, referred to as a "main cell"). However, in an exemplary embodiment, the string further comprises at least one dummy cell together with 32 memory cells, one of which will be defined by an external address. The dummy cell may be placed at any location in the string. Yet, it may be beneficial to place the dummy cell at a position where the charge sharing of a program-inhibited memory cell is minimized.

Still referring to FIG. 4, for example, a dummy cell is placed between a memory cell MC<N−1> and a memory cell MC<N>. This arrangement may be repeated in each string that constitutes a memory block. That is, dummy cells in strings are placed so as to be connected in common to a dummy word line DWL. As described above, the position of the dummy cells DMC is designated so as to block the charge sharing that occurs due to the memory cell MC<N−1>.

The position of the dummy cells DMC may be determined during a test run of the manufacturing process. This is because the charge sharing characteristics of the memory cells usually depends on the type of manufacturing process. Thus, the position of the dummy cells DMC may be determined after estimating their performance based on their positions during the test run of the manufacturing process. The estimated position of the dummy cells DMC may be stored using a variety of methods. For example, the estimated position of dummy cells can be stored using a fuse option circuit or non-volatile memory cells.

In order to ensure that a program-inhibit cell cannot be programmed, each of the dummy cells DMC is programmed to have the highest state (refer to FIG. 6) before performing a programming operation of main cells. Furthermore, the same or lower voltage as that applied to unselected word lines is applied to the dummy word line DWL. This may ensure that a memory cell in a selected word line and an unselected bit line is concretely program-inhibited. Therefore, the reliability of the flash memory device can be improved.

Figure 5:
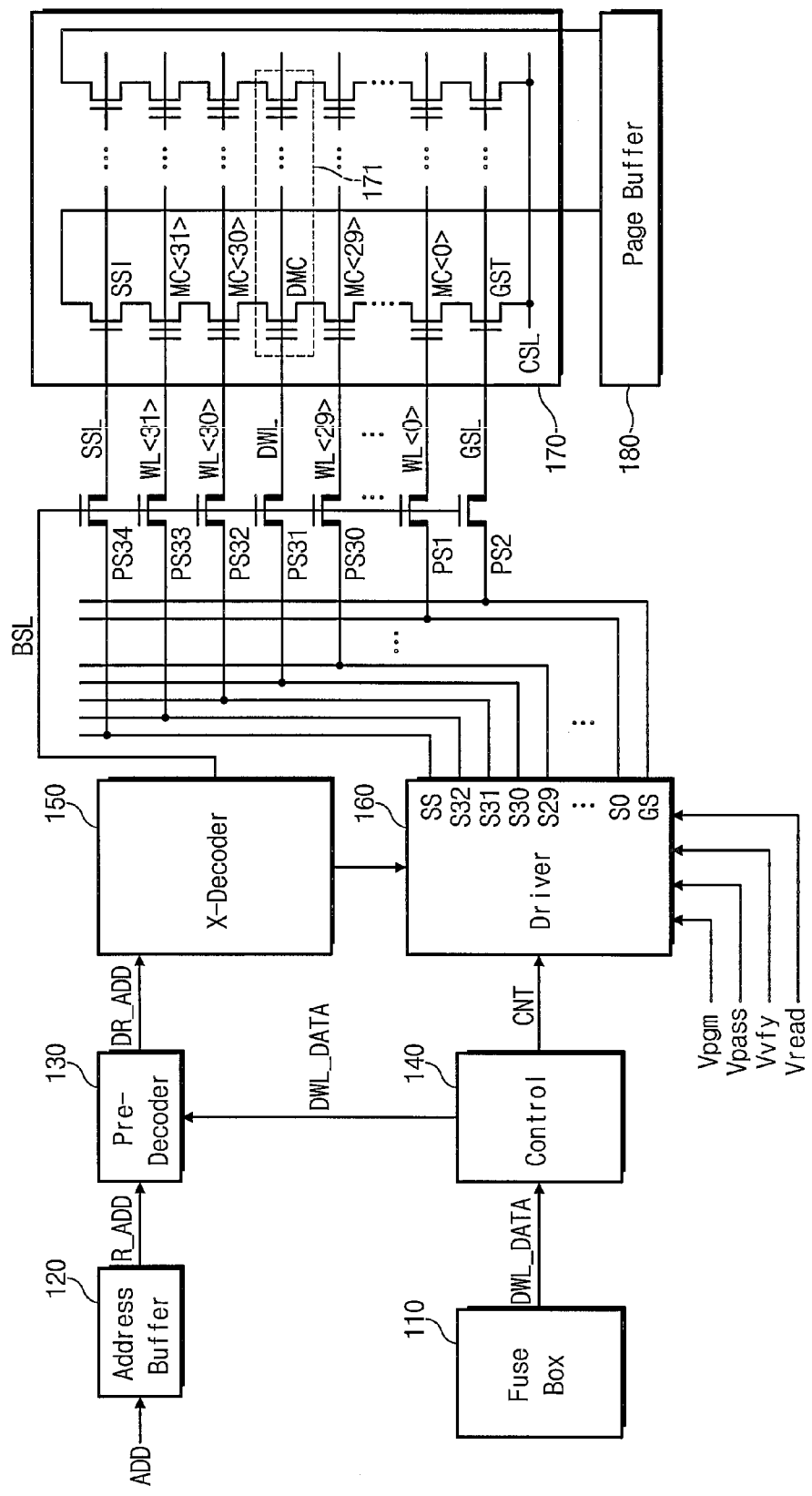
FIG. 5 is a block diagram of a flash memory device according to an exemplary embodiment of the present invention.

FIG. 5 shows a schematic block diagram of a NAND flash memory device according an exemplary disclosed embodiment. The NAND flash memory device includes a fuse box 110, an address buffer 120, a pre-decoder 130, a control unit 140, an X-Decoder 150, a driver block 160, a block of memory cells 170, and a page buffer 180. The flash memory device also includes strings of memory cells, each string including memory cells MC<0>-MC<31>. In addition, word lines WL<0>-WL<31> are applied to corresponding memory cells. Furthermore, the flash memory device also includes dummy memory cells DMC 171 in each string. Each DMC 171 is applied a dummy line voltage.

In an exemplary embodiment, the flash memory device is supplied with an external row address R_ADD which has no information for selecting a dummy word line in a block. However, an internal row address DR_ADD having information for selecting a dummy word line is generated by the pre-decoder 130 based on dummy word line data DWL_DATA that is stored in a fuse box 110. Thus, the dummy word line DWL can be supplied with the same word line voltage as the word line voltage that is supplied to the unselected word line during the programming and reading operations. The dummy cells are programmed to the highest state during the dummy cell program operation which is performed after a block erase operation.

Referring to FIG. 5, the flash memory device is configured to apply the dummy word line voltage. The dummy word line voltage may be applied in response to dummy word line data DWL_DATA. The DWL_DATA may be stored in a fuse box 110. As mentioned above, the dummy word line voltage is the same or lower than the voltage applied to unselected word lines during a programming/reading operation. Furthermore, a program voltage is supplied to a dummy word line DWL to program the dummy cells 171 into the highest state after a block erase operation.

As mentioned above, the fuse box 110 is configured to store the dummy word line data DWL_DATA. The DWL_DATA comprises position information of a dummy word line DWL in a block. Similar to the position of the dummy cells as described above, the position of the dummy word line DWL may vary according to the manufacturing process used for the flash memory device. For example, as described above, the position information of the dummy word line DWL can be determined after estimating its performance based on DWL positions during a test manufacturing process. In addition, the estimated position data of the dummy word line is saved/programmed as the dummy word line data DWL_DATA into the fuse box 110. Although the fuse box 110 is used to store the dummy word line data DWL_DATA, one skilled in the art will appreciate that other components may be used to store the dummy word line data DWL_DATA. For example, non volatile memory may be used to store the dummy word line data DWL_DATA.

The address buffer 120 transmits an external address ADD to the pre-decoder 130. The address buffer 120 then translates this external address ADD to a row address R_ADD. The pre-decoder 130 translates the row address R_ADD from the address buffer 120 to an address DR_ADD. This translation is performed in response to the dummy word line data DWL_DATA received by the pre-decoder 130 from the control unit 140. The address DR_ADD comprises a dummy word line address. While the row address R_ADD has no information for selecting the dummy word line, the row address DR_ADD has the information needed for selecting the dummy word line.

For example, if the number of word lines to be selected by the external row address is 32, the pre-decoder 130 generates the internal row address DR_ADD to select 33 word lines. Thus, the pre-decoder 130 includes information about the additional word line, i.e., the DWL. As is well known by one skilled in the art, the number of word lines in a block is not limited hereto.

The control unit 140 controls the driver block 160. The driver block 160 is configured to execute the programming, erasing, reading operations of the flash memory device including the dummy word line. Specifically, the control unit 140 controls the driver block 160 to supply a word line voltage to a word line WL<0>. In addition, the control unit 140 controls the pre-decoder 130 to skip the programming operation of the dummy word line during a block programming operation. Furthermore, the control unit 140 controls the driver block 160 to apply the same word line voltage to the DWL as that applied to unselected word lines during the reading operation. During the erase operation, the control unit 140 controls the driver block 160 to apply a ground voltage to all word lines. This application of a ground voltage to all word lines may help the control unit 140 execute an erase operation when, for example, an erase voltage (e.g., 18V) is applied to a p-type well of the block.

Figures 6, 7:
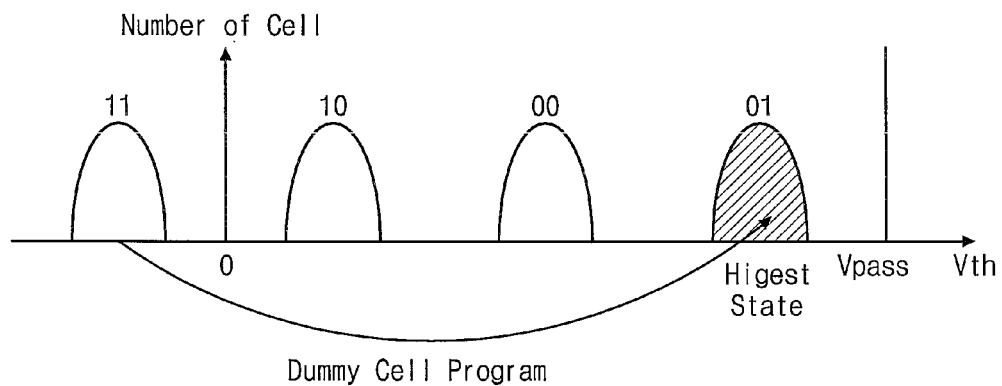
FIG. 6 is a diagram for describing an exemplary programming operation of a dummy cell in FIG. 5.
FIG. 7 is a table showing bias conditions according to an exemplary programming operation of the dummy cell.

After the erasing operation, the control unit 140 controls the driver block 160 to apply the program voltage to the word line so that the dummy cells are programmed into the highest state (refer to FIG. 6). At this point, the page buffer block 180 will bias all bit lines in a block to program all dummy cells into the highest state. In other words, the control unit 140 controls the driver block 160 and pre-decoder 130 to control the operation of the flash memory device notwithstanding the difference in the address between external row address and internal row address in response to the dummy word line data DWL_DATA.

The X-decoder 150 selects the block of cells to be programmed according to the internal row address from the pre-decoder 130. Specifically, the X-decoder 150 selects the block by activating a block selection line BLS. The block selection line BLS commonly switches on/off high voltage switches PS0-PS34. Furthermore, the X-decoder 150 transmits the internal row address to the driver block 160. Thus, the X-decoder 150 selects 32 word lines WL<0>~WL<31>, the dummy word line DWL, and 2 selection lines SSL and GSL.

The driver block 160 applies word voltages and selection line voltages in accordance with a control signal CNT from the control unit 140 and an internal row address from the X-decoder 150. For example, the driver block 160 applies the program voltage Vpgm to the selected word line and the pass voltage Vpass to unselected word lines during the programming operation. In addition, the driver block 160 applies a verifying voltage Vvfy to the selected word line and the read voltage Vread to the dummy word line (DWL). Furthermore, the driver block 160 applies the same voltage to the DWL as that to the unselected word lines during a reading operation.

In particular, during an erase operation, the driver block 160 applies a ground voltage (0V) to all word lines including the dummy word line and then the erase voltage to the p-type well, so that all memory cells in the block 170 are erased at the same time. After the erase operation, the dummy cell is programmed under the control of the control unit 140, which will be referred to as a 'dummy cell program'. In an exemplary embodiment, the dummy cell program operation is part of the erase process. During the dummy cell program operation, dummy cells are programmed to be at the highest state among the possible states the dummy cell can be in. For example, as illustrated in FIG. 6, each dummy cell is programmed to be at a state [01], i.e., the state within the highest threshold voltage distribution.

Referring back to FIG. 5, the cell array 170 comprises plural blocks each of which contains one dummy word line that is connected in common to dummy cells. While only one block is illustrated in FIG. 5, one skilled in the art will appreciate that the cell array 170 may includes more blocks that are configured to have the same string structure as illustrated in FIG. 5.

The page buffer block 180 is configured to store data to be programmed through the bit lines to the cell array. Although not illustrated in FIG. 5, the page buffer block 180 may be configured to comprise latches corresponding to bit lines or a half of the bit lines. During a read operation, the page buffer block 180 senses data of selected memory cells through the bit lines. The sensed data is transmitted to an external circuit through a column pass gate (not shown). On the other hand, during a programming operation, data to be programmed to the memory cell 170 is latched in the page buffer block 180. Furthermore, the page buffer block 180 is configured to set up the bit lines with a ground voltage (0V) during the dummy cell program operation so as to program the dummy cells to the highest state possible.

FIG. 6 is a diagram illustrating a dummy cell program operation performed after a block erase operation according to an exemplary embodiment. Referring to FIG. 6, a dummy cell is programmed to be shifted from an erase state [11] to the highest state [01] during the dummy cell program operation. Specifically, FIG. 6 illustrates four possible states [11], [10], [00] and [01] of a 4 level multi-leveled cell MLC. But as is well known to those skilled in the art, any number of states are possible. For example, a memory cell can be a multi leveled cell which stores 3-bit data. In this case, there would be eight possible states for the multi-leveled MLC.

The dummy cell programmed to the highest state can minimize the charge sharing to a program-inhibited cell in a string. This is accomplished by narrowing a channel that is formed by the pass voltage applied to the gate of dummy cell programmed to the highest state. Specifically, the threshold voltage of a cell transistor programmed to the highest state is distributed within a threshold voltage distribution of the highest state. Thus, when a dummy cell has a threshold voltage within a threshold voltage distribution corresponding to the highest state, its channel formed may be relatively short when a gate voltage is applied to the dummy cell. This shortened channel can minimize the charge sharing in a string when the pass voltage Vpass is applied to its gate.

FIG. 7 illustrates a table of the word line, bit line and selection line voltage supplied during the program, read, erase, and dummy cell program, operations in an exemplary embodiment.

In a programming operation, a program voltage Vpgm is applied to a selected word and a pass voltage Vpass is applied to unselected word lines. Furthermore, a power supply voltage Vcc is applied to a string selection line SSL. In addition, a ground voltage 0V is applied to a ground selection line GSL and a common source line CSL. Beneficially, during the programming operation, the pass voltage Vpass is also applied to a dummy word line DWL. Furthermore, a ground voltage 0V is applied to bit lines connected to cells to be programmed, and a power supply voltage Vcc is applied to bit lines connected to cells to be program-inhibited.

In a read operation, the power supply voltage Vcc is supplied to the string selection and ground selection lines SSL and GSL. In addition, the ground voltage 0V is applied to the common source line CSL. Also, a read voltage Vrd is applied to the selected word line. Furthermore, a pass voltage Vread is applied to the unselected word lines to turn on the channel of unselected cell transistors. The same pass voltage Vread is also applied to the DWL.

In an erase operation, all bit lines, the string selection line SSL, the ground selection line GSL, and the common selection line CSL are set to retain a floating state. The floating state means that signal lines are not connected to any voltage source. Furthermore, a ground voltage 0V is applied to all word lines including the dummy word line. In addition, an erase voltage (e.g., about 18V) is applied to the p-type well to induce the F-N tunneling, which extracts the electrons from the floating gate.

In an exemplary embodiment, after the erase operation, the dummy cell program operation is preformed to change the state of the dummy cells to the highest possible state. The dummy cell program is performed under the control of the control unit 140 (refer to FIG. 5). In order to program the dummy cells coupled to the dummy word line to the highest state, the page buffer block 180 applies the ground voltage of 0V to all bit lines. Furthermore, the pass voltage Vpass is applied to all word lines except the dummy word line DWL. At this time, as shown in FIG. 7, a power supply voltage Vcc is applied to the string selection line SSL. In addition, a ground voltage 0V is applied to the ground selection line GSL and the common source line CSL. Under the above-mentioned bias condition, the dummy cells are programmed to have the highest state.

As mentioned above, the bias conditions applied to the bit lines, selection lines, and word lines including the dummy word line are established by operating the control unit 140 based on dummy word line data DWL_DATA that is stored in a fuse box 110. In an exemplary embodiment, no further address is required to select a dummy word line. That is, the disclosed flash memory device is configured to select a dummy word line using internal information that is stored in a fuse box 110, together with an external address. For this reason, it may not be necessary to modify an external interface of the flash memory device.

Figure 8:
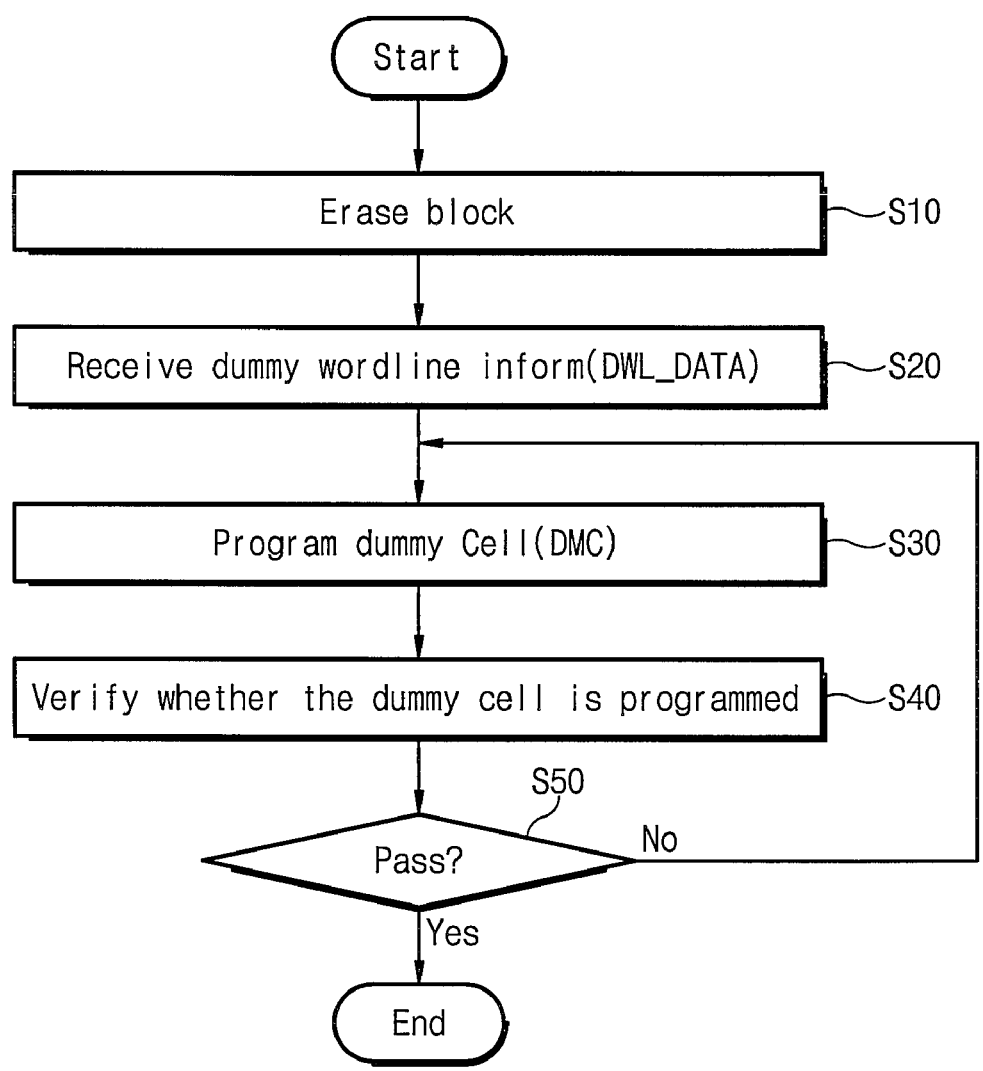
FIG. 8 is a flow chart for describing an erasing operation according to an exemplary disclosed embodiment of the present invention.

FIG. 8 is a flow chart describing erase and dummy cell program operations in an exemplary disclosed embodiment. As far as initializing the memory cells is concerned, the dummy cell program operation can be categorized as an erase procedure in a broad sense. Hereinafter, the present erase procedure will be more fully described with reference to FIG. 8.

At the beginning of the erasing operation, at step S10, all memory cells in a target block are erased under the bias condition shown in FIG. 7. That is, the erased memory cells are initialized to have the lowest state (e.g., [11]). Furthermore, the control unit 140 generates the control signal CNT based on the dummy word line data DWL_DATA from fuse box 110. At step S20, the control unit 140 transmits the dummy word line data DWL_DATA to a pre-decoder 130 to generate the internal row address DR_ADD. At step S30, dummy cells are programmed to have the highest state (e.g., [01]). In particular, a program voltage Vpgm is applied to a dummy word line so that dummy cells are programmed to the highest state. In an exemplary embodiment, the dummy cell program operation may be executed using the ISPP (Incremental Step Pulse Programming) scheme. However, one skilled in the art will appreciate that the dummy cell program operation is not limited to the ISPP scheme. After completing the dummy cell program operation, at step S40, the verifying operation for verifying programmed states of dummy cells is performed. If all dummy cells are programmed to have the highest state, the dummy cell program operation may end. However, if any one of the dummy cells is not programmed to the highest state, the steps S30 to S50 are repeated until all dummy cells are sufficiently programmed to have the highest state.

The disclosed memory scheme including dummy memory cells may be used in any flash memory device. By programming the dummy cells to the highest possible state, it may be possible to minimize the above-mentioned charge sharing phenomenon while still increasing the number of memory cells in each string.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of erasing a flash memory device, the method comprising:
   erasing memory cells connected to a plurality of word lines; and
   programming a memory cell connected to a dummy word line to a predetermined state.

2. The method as set forth in claim 1, wherein the predetermined state is a highest state among a plurality of program states of the memory cell.

3. The method as set forth in claim 1, wherein a threshold voltage of the memory cell corresponding to the predetermined state is lower than a pass voltage supplied to an unselected word line during a program operation.

4. The method as set forth in claim 1, wherein the memory cell connected to the dummy word line is programmed in an incremental step pulse programming (ISPP) mode.

5. The method as set forth in claim 1, wherein the memory cell connected to the dummy word line is programmed in a single pulse programming mode or multiple pulse programming mode.

6. The method as set forth in claim 1, further comprising: determining a position of the dummy word line among the plurality of word lines to minimize a charge sharing in a string including a program-inhibited memory cell.

7. The method as set forth in claim 6, further comprising: storing the determined position as position information in a storage device.

8. The method as set forth in claim 7, further comprising: receiving the position of the dummy word line from the storage device before programming the memory cell connected to the dummy word line.

9. The method as set forth in claim 1, further comprising: supplying a same voltage to the memory cell connected to the dummy word line as that supplied to a control gate of unselected memory cells during programming, reading, or erasing operations.

* * * * *